United States Patent
Arntz et al.

(10) Patent No.: US 6,564,173 B1
(45) Date of Patent: May 13, 2003

(54) REMOTE MULTIPLEXED DIAGNOSTIC CIRCUITRY AND A METHOD OF DETECTING FAULTS IN SEQUENTIALLY DRIVEN LOADS

(75) Inventors: Robert T Arntz, Auburn Hills, MI (US); Pawel J Golab, Birmingham, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 254 days.

(21) Appl. No.: 09/690,952

(22) Filed: Oct. 17, 2000

(51) Int. Cl.$^7$ .............................................. G06F 11/30
(52) U.S. Cl. ....................... 702/183; 318/445
(58) Field of Search ................................ 702/183, 185, 702/124, 125, 79, 33, 35; 318/4, 565, 590, 628, 638, 650, 49, 50, 52, 98, 101, 102, 705, 255, 445, 453, 495; 324/512, 772; 700/3, 9, 19, 21, 110, 169; 361/211; 307/43, 52, 139

(56) References Cited

U.S. PATENT DOCUMENTS

| | | | |
|---|---|---|---|
| 4,446,458 A | * | 5/1984 | Cook ......................... 340/3.21 |
| 4,521,871 A | * | 6/1985 | Galdun et al. ................. 700/82 |
| 4,556,882 A | | 12/1985 | Brifman et al. ......... 340/825.06 |
| 4,736,367 A | * | 4/1988 | Wroblewski et al. ....... 307/10.1 |
| 4,764,729 A | | 8/1988 | Yakuwa et al. ............. 324/546 |
| 4,937,811 A | * | 6/1990 | Harris ........................ 370/200 |
| 5,128,567 A | * | 7/1992 | Tanaka et al. ............... 327/264 |
| 5,243,336 A | | 9/1993 | Noonan et al. ..... 340/825.18 D |
| 5,272,441 A | | 12/1993 | Wright et al. ................ 324/546 |
| 5,289,043 A | | 2/1994 | Marshall et al. ............... 307/38 |
| 5,345,181 A | | 9/1994 | Mantani et al. ............. 324/546 |
| 5,430,438 A | | 7/1995 | Joos et al. ............. 340/825.16 |
| 5,519,726 A | * | 5/1996 | DiCarlo ...................... 370/461 |
| 5,696,695 A | * | 12/1997 | Ehlers et al. ................ 307/115 |
| 5,721,688 A | * | 2/1998 | Bramwell .................... 320/128 |
| 5,875,328 A | * | 2/1999 | Pearson .......................... 700/3 |
| 6,148,258 A | * | 11/2000 | Boisvert et al. ........ 123/145 A |
| 6,308,140 B1 | * | 10/2001 | Dowling et al. ............ 324/772 |
| 6,415,244 B1 | * | 7/2002 | Dickens et al. ............. 702/187 |

* cited by examiner

*Primary Examiner*—Marc S. Hoff
*Assistant Examiner*—Edward Raymond
(74) *Attorney, Agent, or Firm*—Edwin W. Bacon, Jr.

(57) ABSTRACT

A method to diagnose electrical failures of remotely driven inductive loads as well as the failures of electrical connections between a controller and a remotely located power module. Circuitry for diagnosing the fault condition of a plurality of remote inductive loads driven by a master module over a corresponding plurality of connection lines. Diagnostic information is mixed or intermodulated onto the connection line for a control signal of a sequential subsequent one of the loads and is transmitting over the connection line from the remote load to the master module for receipt by a controller in the master module. The control signal was not responsible for driving that particular load from which the diagnostic information was taken. The loads are sequentially driven so that the diagnostic information is multiplexed onto the connection lines which aids in helping the controller to recognize the fault condition.

25 Claims, 12 Drawing Sheets

REMOTE MULTIPLEXED DIAGNOSTIC CIRCUITRY AND A METHOD OF DETECTING FAULTS IN SEQUENTIALLY DRIVEN LOADS

BACKGROUND OF THE INVENTION

1. Field of the Invention

The present invention relates to circuitry for and a method of diagnosing electrical failures of remotely driven inductive loads, and failures of electrical connections between a master module and a remotely located power module.

2. Description of Related Art

Many conventional electronic controllers require a signal (or signals) to diagnose the status of output lines. When a controller drives inductive loads, a typical diagnostic procedure may call for checking that a fly-back voltage pulse is generated when each inductive load is switched. Conventionally, dedicated wires and pins are needed to convey such diagnostic information in the form of the fly-back voltage pulse. Recently, design constraints in automotive design require that the number of input and output pins and wires be kept to a minimum so as to lower the cost of the electronic control system, but without sacrificing reliability. Under such constraints, dedicated wires and pins are no longer a viable design option.

In automotive or industrial systems it is sometimes essential to place the power device drivers close to the loads but separate from the controller (microcomputer, etc.). The reasons to do this can be for safety, cost, noise and etc. However, the diagnostic problem becomes more complex when the loads are remotely driven (i.e., where the power drivers are physically separated from the controller). For example, the length of diagnostic lines would be great.

It would therefore be desirable to provide circuitry for and a method of ascertaining the diagnostics of inductive loads without relying on dedicated input and output pins and wires.

SUMMARY OF THE INVENTION

One aspect of the invention relates to mixing diagnostic information, such as a fly-back pulse or pulses that correspond to specific waveform characteristics of one sequentially driven inductive load, onto a presently unused control signal line from which another one of the loads will be driven. After mixing, the diagnostic information is transmitted from a remote module to a physically separate master module via at least one connection line between the modules that carries a control signal other than that which drove the inductive load, thus yielding the diagnostic information back at the master module.

In an illustrative embodiment of the invention, an apparatus and method for detecting diagnostic information of sequentially driven loads is realized by:

sequentially driving inductive loads in response to the transmission of associated control signals from a master module to a remote module via respective connection lines, the modules being physically separate from each other and the connection lines electrically connecting the modules together;

generating diagnostic signals in sequence that correspond with specific waveform characteristics of the output current from respective driven inductive loads; and multiplexing the diagnostic signals in sequence into a pulse train and transmitting pulses of the pulse train to the master module via sequential ones of the connection lines so that the diagnostic signals associated with each currently driven one of the inductive loads are transmitted through a next one of the connection lines that is other than that through which the currently driven one of the inductive loads was sequentially driven.

BRIEF DESCRIPTION OF THE DRAWING

While the scope of the invention is set forth in the appended claims, a better understanding of the present invention can be had by reference to the following description and accompanying drawings, wherein:

DESCRIPTION OF THE PREFERRED EMBODIMENT

Figure 1A:
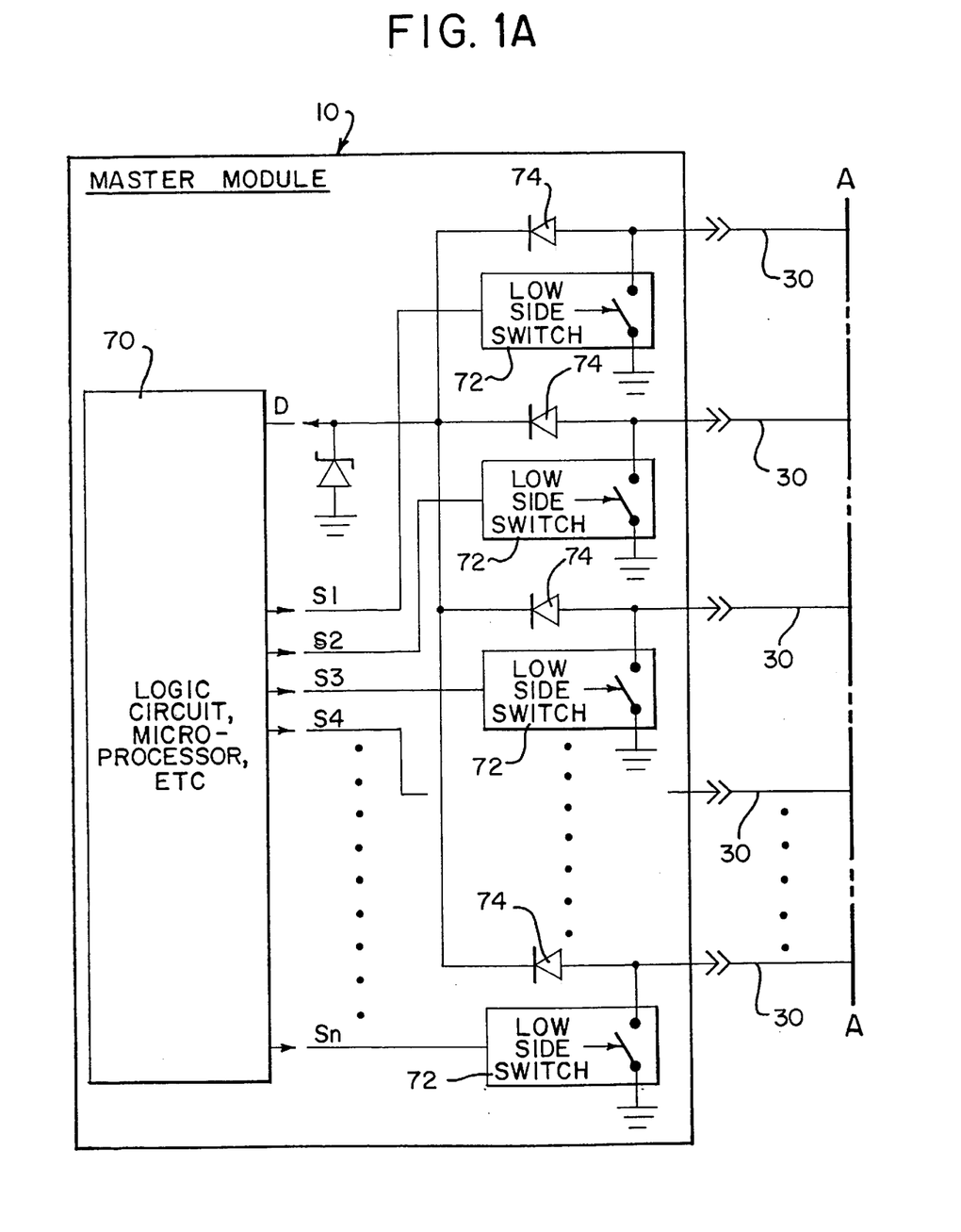
FIGS. 1A and 1B together illustrate a schematic representation of the circuitry of an electronic control system with "N" inductive loads sequentially driven in accordance with the invention.
Figure 1B:
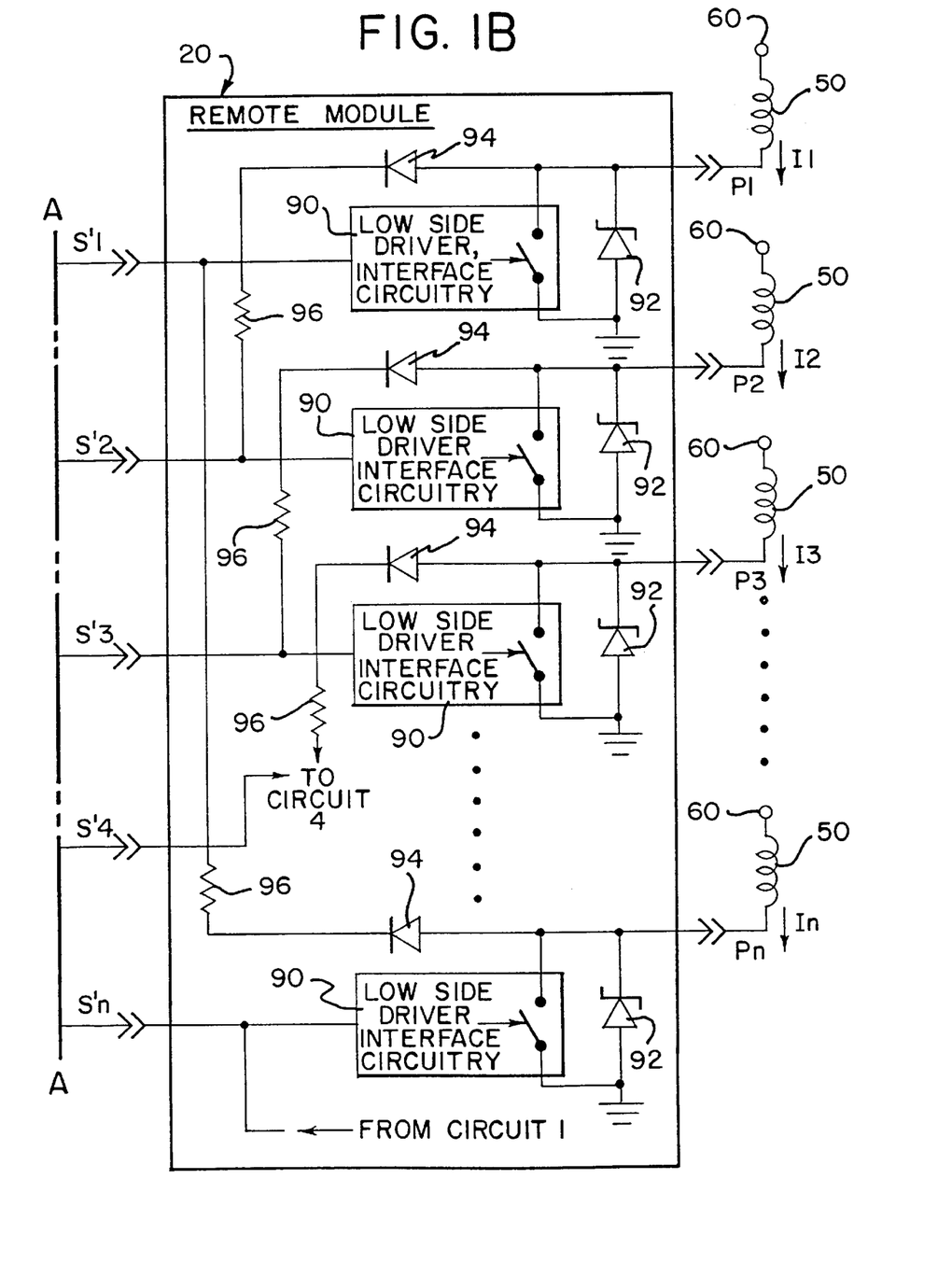

FIGS. 1A and 1B together present an example of an electronic control system according to the present invention with "N" inductive loads 50. FIGS. 2–5 present examples of the waveforms for a system with N=4. The master module 10 uses "N" signals (S'1, S'2, ... S'n) to control a remote power module as shown in FIG. 1. The remote power module is driving "N" inductive loads L1, L2, ... Ln (actuators, injectors, etc.) 50. An obvious way to send fly-back pulses (P1, P2, ... Pn) back to the master module for diagnostic purposes would be to use an additional wire or wires.

Figure 6A:
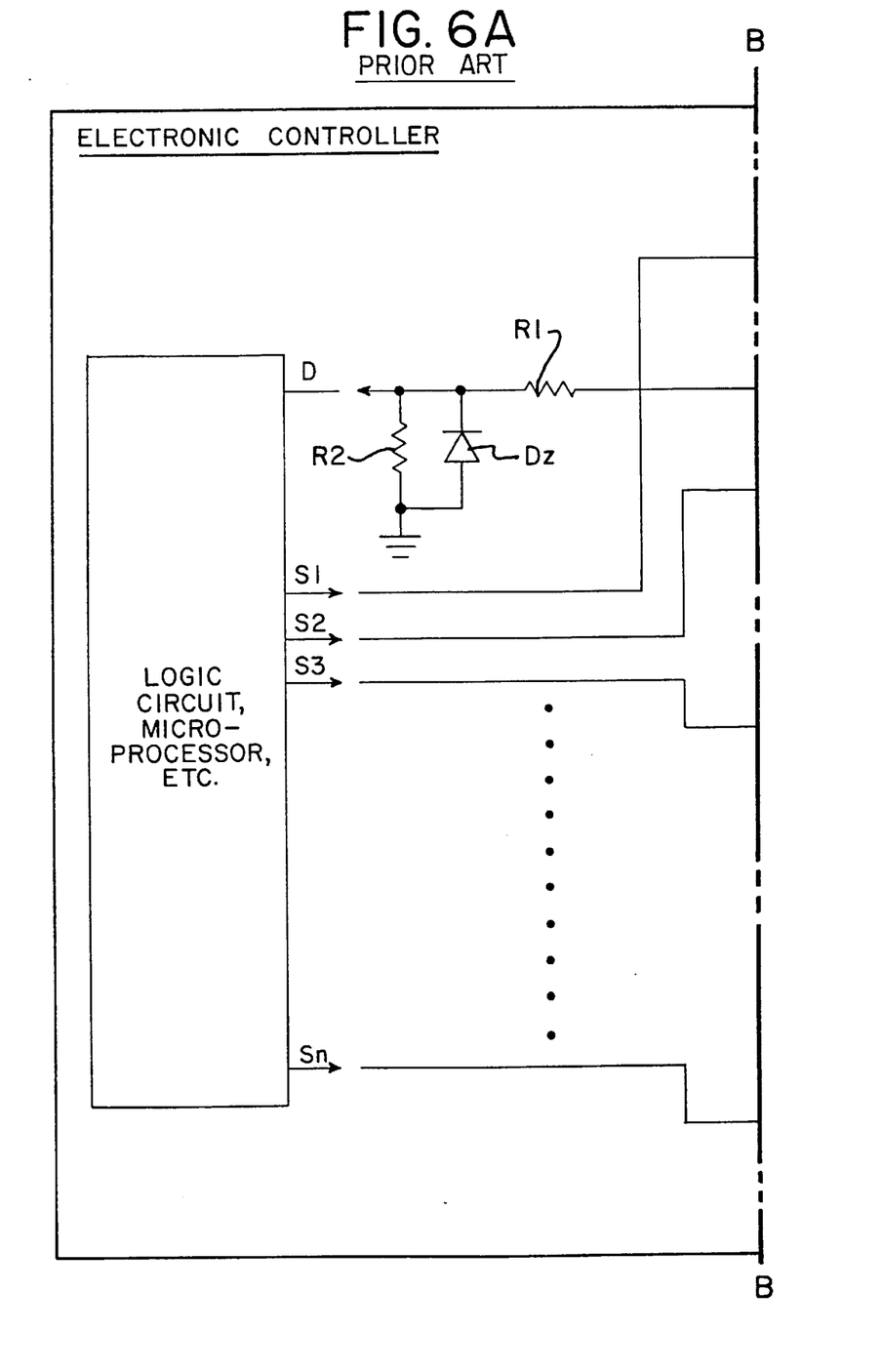
FIGS. 6A and 6B together illustrate a schematic diagram of conventional circuitry with local drivers.
Figure 6B:
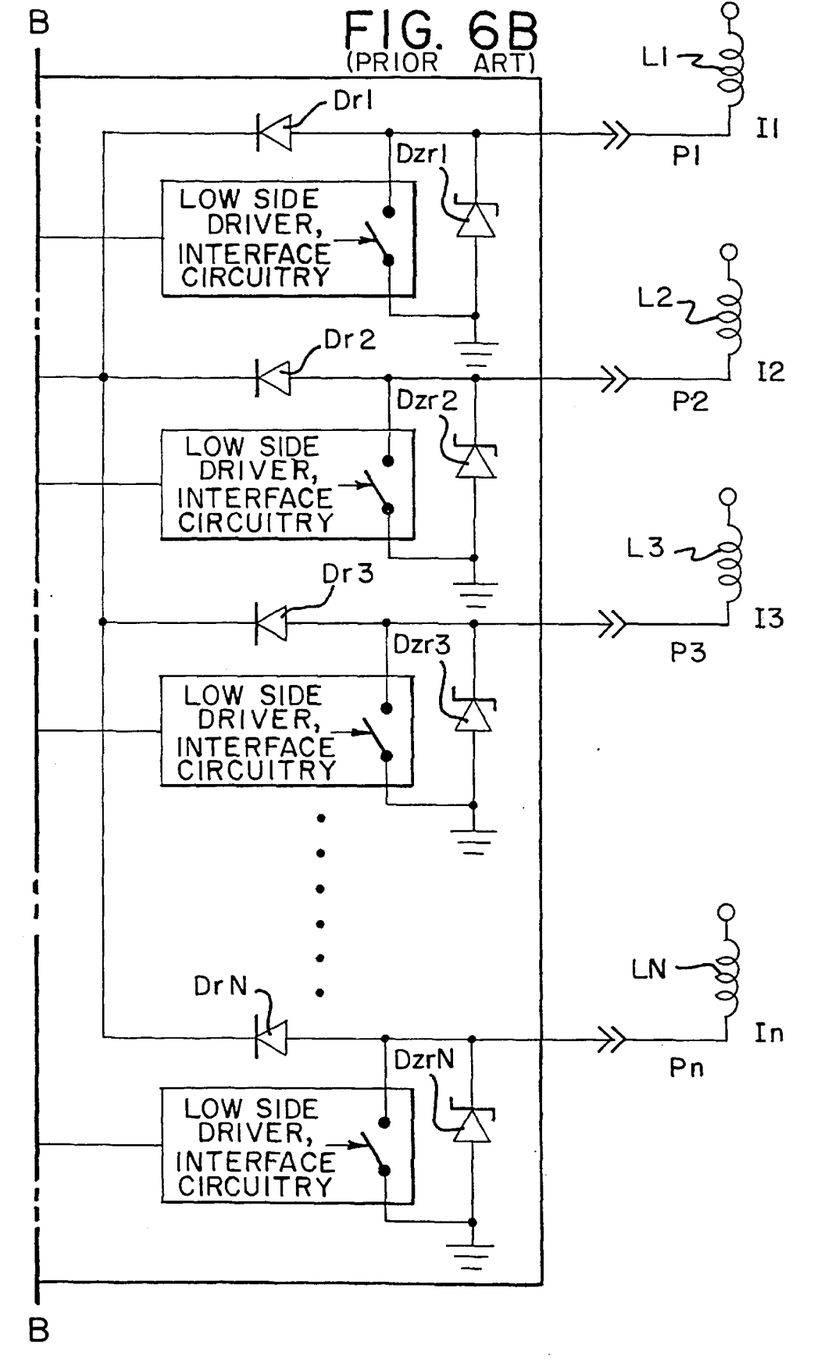
Figure 7A:
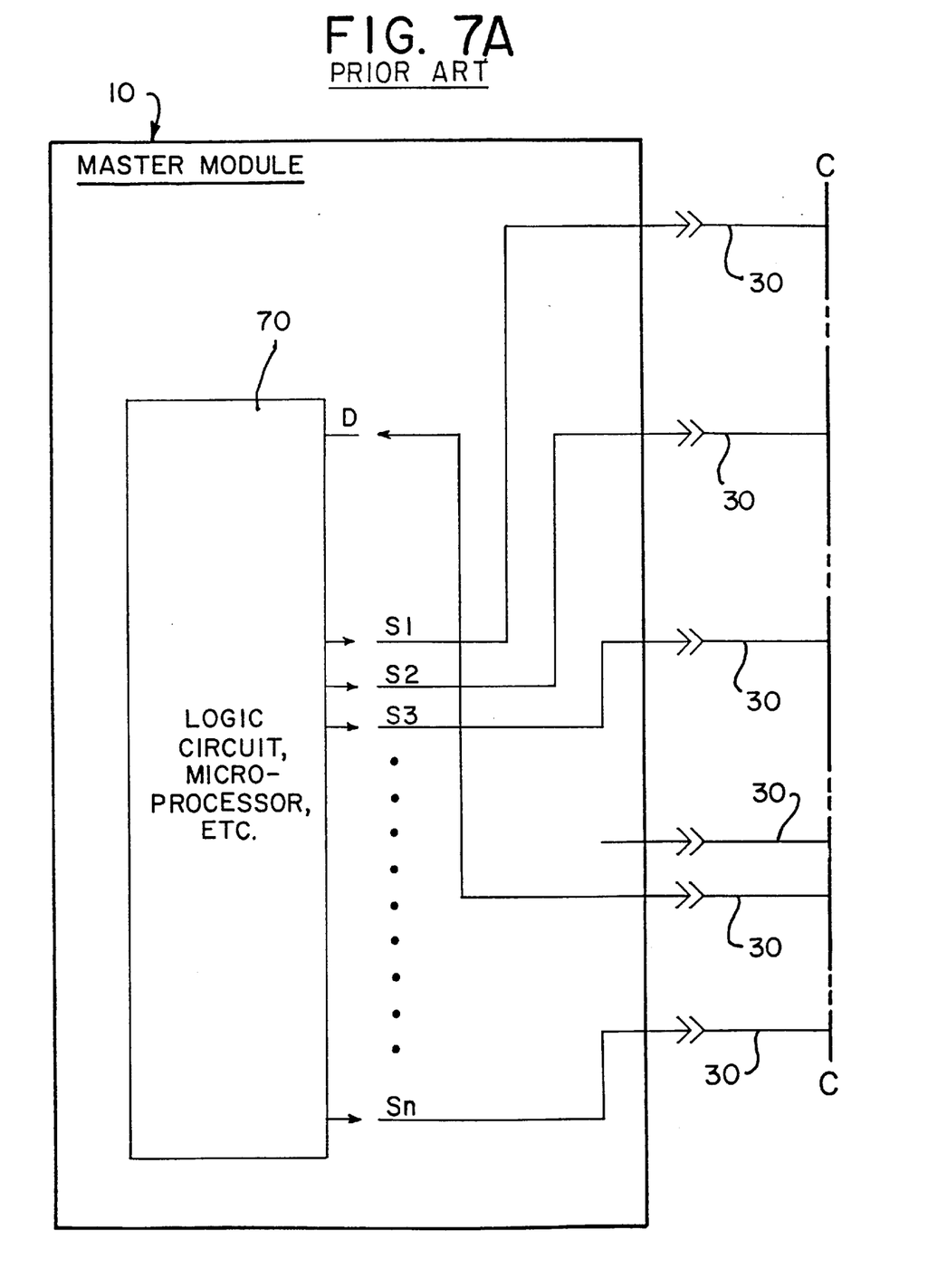
FIGS. 7A and 7B together illustrate a schematic diagram of conventional circuitry with remote drivers.
Figure 7B:
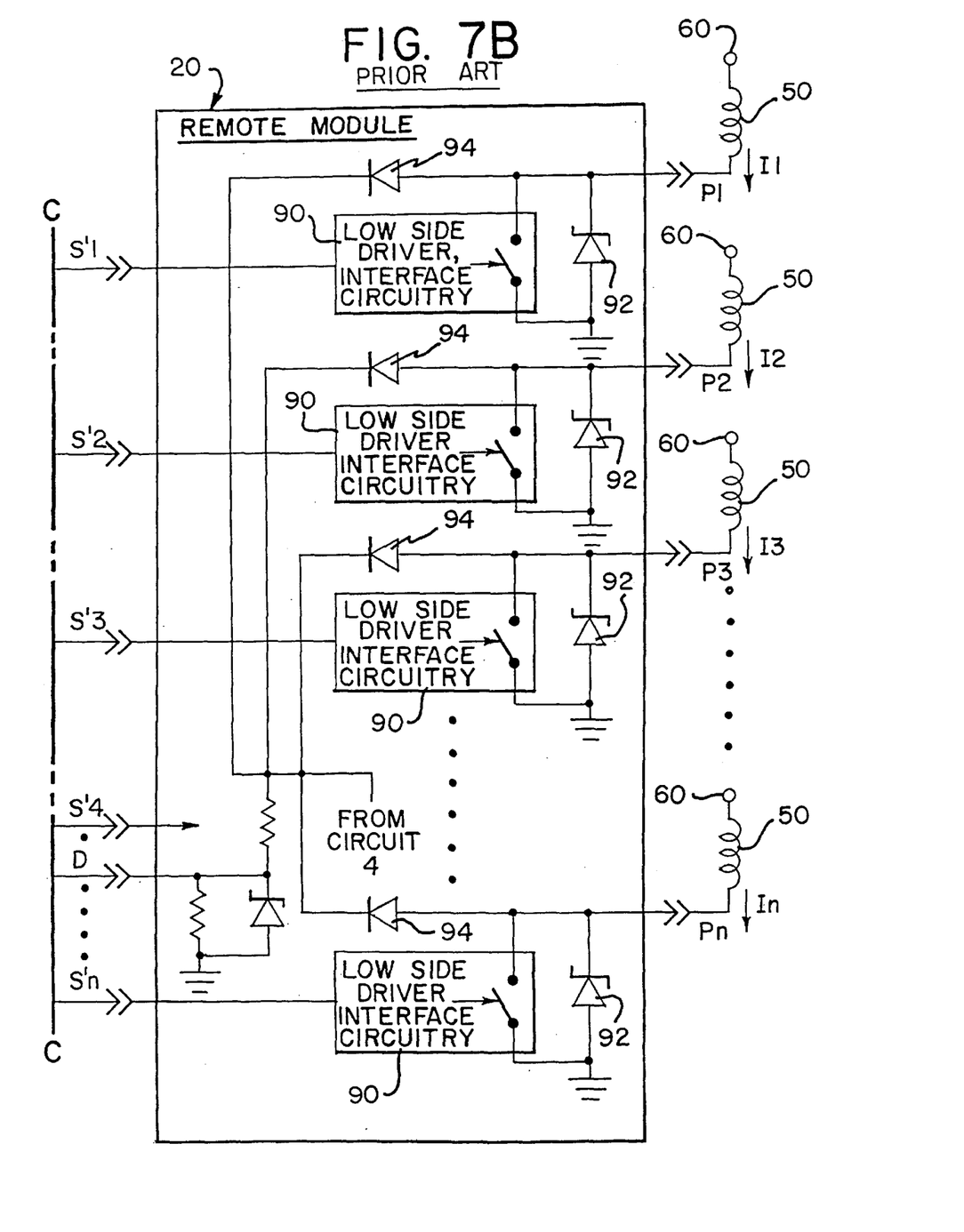

FIGS. 6A and 6B together show only a conventional sensing circuit where the low side drivers are local with the logic circuits. FIGS. 7A and 7B show conventional sensing circuitry where the low side drivers are remote from the logic circuits.

In changing from FIGS. 6A and 6B to FIGS. 7A and 7B the number of components did not change. The waveforms are exactly the same and there is one common diagnostic line D between the modules. Now, for example, if the diagnostic pulses from signal P2 are missing from pulse train signal D, the controller could not distinguish between a failed load (current I2 was not present) and a broken connection between the master and remote modules (line S2 is open or shorted). These two situations give the same feedback signal. This problem is solved by this invention.

According to the present invention, the separate diagnostic line or lines can be eliminated by utilizing the unused drive lines 30 to provide the diagnostic signals to the microprocessor.

The proposed diagnostic configuration allows the diagnostic pulses to be sent through a line which is not actually "in use". Certain requirements have to be met to make this possible. The intermodule controls signals S'1, S'2, S'3, ... S'N, have to be negative going pulses (active low). This is achieved by the low side drivers 72 used as outputs in the master module. If signals S1, S2, S3, ... SN are positive going pulses, these low side drivers (invertors) must be added. The fly-back pulse (P1) generated on the load (L1) is sent through additional diode Dm1 94 and resistor R1 96 to the input of the next driver (S'2). The same is done for the load L2 and L3, etc. Note that signal (PN) from load LN is fed to the input S'1 in a circular or sequential manner. In this way the fly-back pulses are separately sent back to the master module and then added together in the summing circuit (Dr1, Dr2, Dr3, ... DrN, R, Dz) to form diagnostic train pulse D.

Referring in more detail to FIGS. 1A and 1B, the present invention uses master module 10, remote module 20 physically separate from the master module, control voltage transmission lines 30 (Line 1–Line n) extending between the modules, and output lines 40 in electrical connection with external inductive loads 50 (L1–Ln) that are powered by the voltage source 60 $V_{bat}$, such as batteries. The master module 10 includes a controller 70 in the form of a logic circuit of a microprocessor and a plurality of low side switches 72 (e.g., FET transistors) in electrical connection with the controller 70. Respective control signals S1, S2, S3 and Sn are transmitted from controller 70 to each low side switch 72. In turn, each low side switch is in electrical connection with a respective one of the control voltage transmission lines 30, which convey respective intermodule control and diagnostic signals S'1, S'2, S'3 and S'n which are the inversion of the control signals S1, S2, S3 and Sn.

Figure 2:
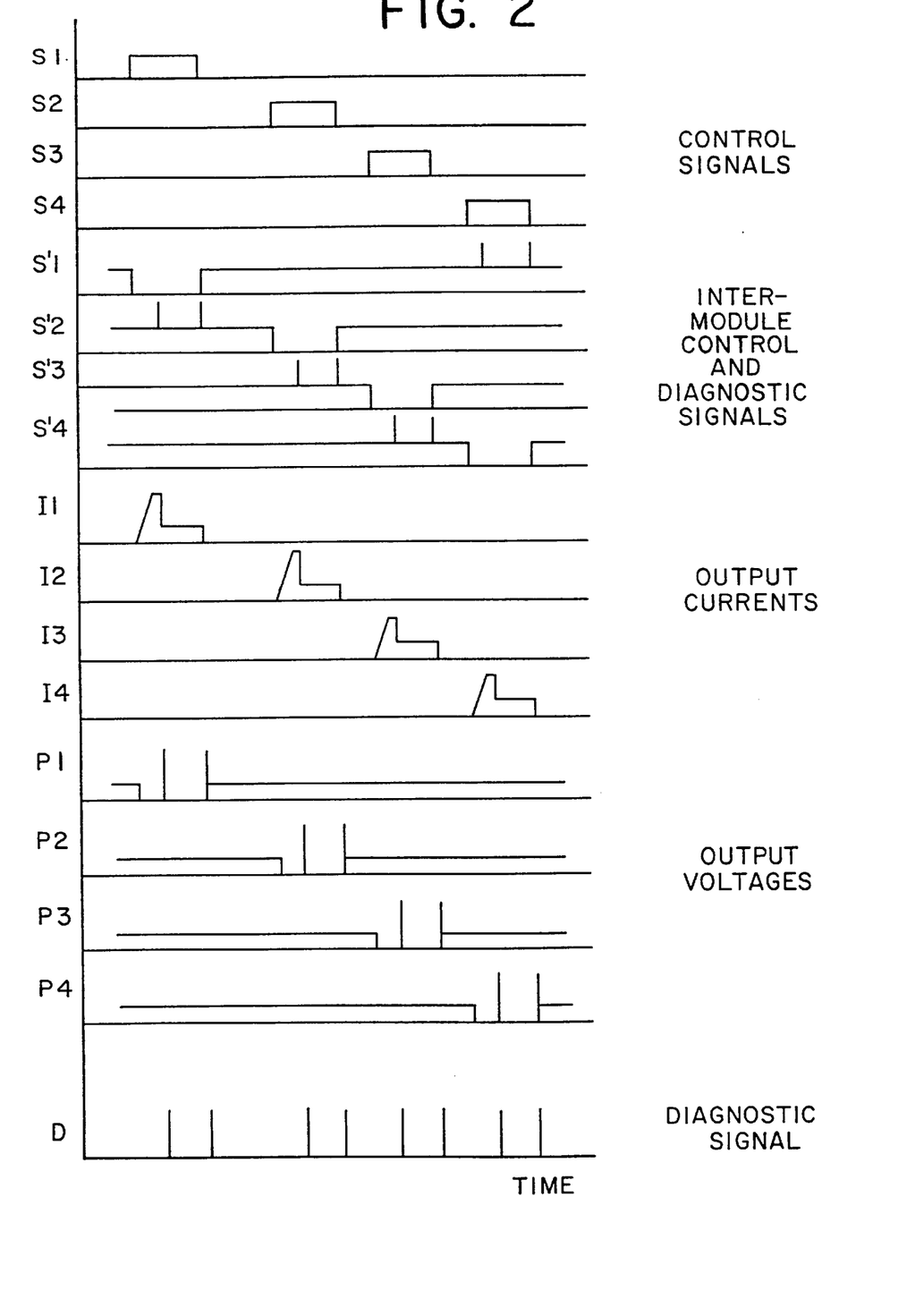
FIG. 2 is a series of waveform diagrams related to the circuitry of FIG. 1 with N=4 under high engine RPM.

In the remote module 20, the low side driver and interface circuitry 90 respond to the negative going square wave pulse of control signals S'1, S'2, S'3 and S'n to drive the inductive loads 50 initially at a high voltage and current level for a short duration and then lower the voltage and current level for a longer duration. The currents I1, I2, I3 and In that are generated have waveform characteristics as shown in FIG. 2. The two sudden drops in current each trigger a respective positive fly-back pulse (P1–P4). The pulses feedback from the inductive loads 50 over the diodes 94 and resistors 96 to the connection line 30 that carries the control signal for another load. The pulse feedback continues over the diodes 74 to mix into a diagnostic pulse train input D (see FIG. 2) that transmits along the common diagnostic line 78 as an input to the microprocessor or controller 70.

In a known manner, the diodes 74 are provided in the diagnostic feedback lines to isolate the feedback signals from each other, much like a diode gate. A zener diode 76 is provided to clamp the voltage on the common diagnostic line 78 to a valve below a prescribed voltage level before the diagnostic signals reach the controller 70, in order to protect the controller from excessive fly-back voltage.

Referring to FIGS. 1A, 1B and 2–5, normal operation of the invention is as follows:

Controller 70 of FIG. 1A transmits control signals S1 to S4 for sequentially driving inductive loads 50 (where N=4 in FIGS. 1A and 1B). These signals may, for example, be in the form of positive square wave pulses. FIG. 2 shows the waveforms for a system with four loads. Positive going signals S1, S2, S3 and S4 are inverted and form signals S'1, S'2, S'3 and S'4 which turn on the low side drivers (or subcircuit performing this function) in the remote module.

The output currents I1, I2, I3 and I4 energize loads L1, L2, L3 and L4. Two sharp changes in the current waveform produce two fly-back pulses such as in P1, P2, P3 and P4. These pulses are superimposed on signals S'1, S'2, S'3 and S'4. This returning voltage pulse on a currently unused line does not disturb the normal function of the power module input.

Figure 3:
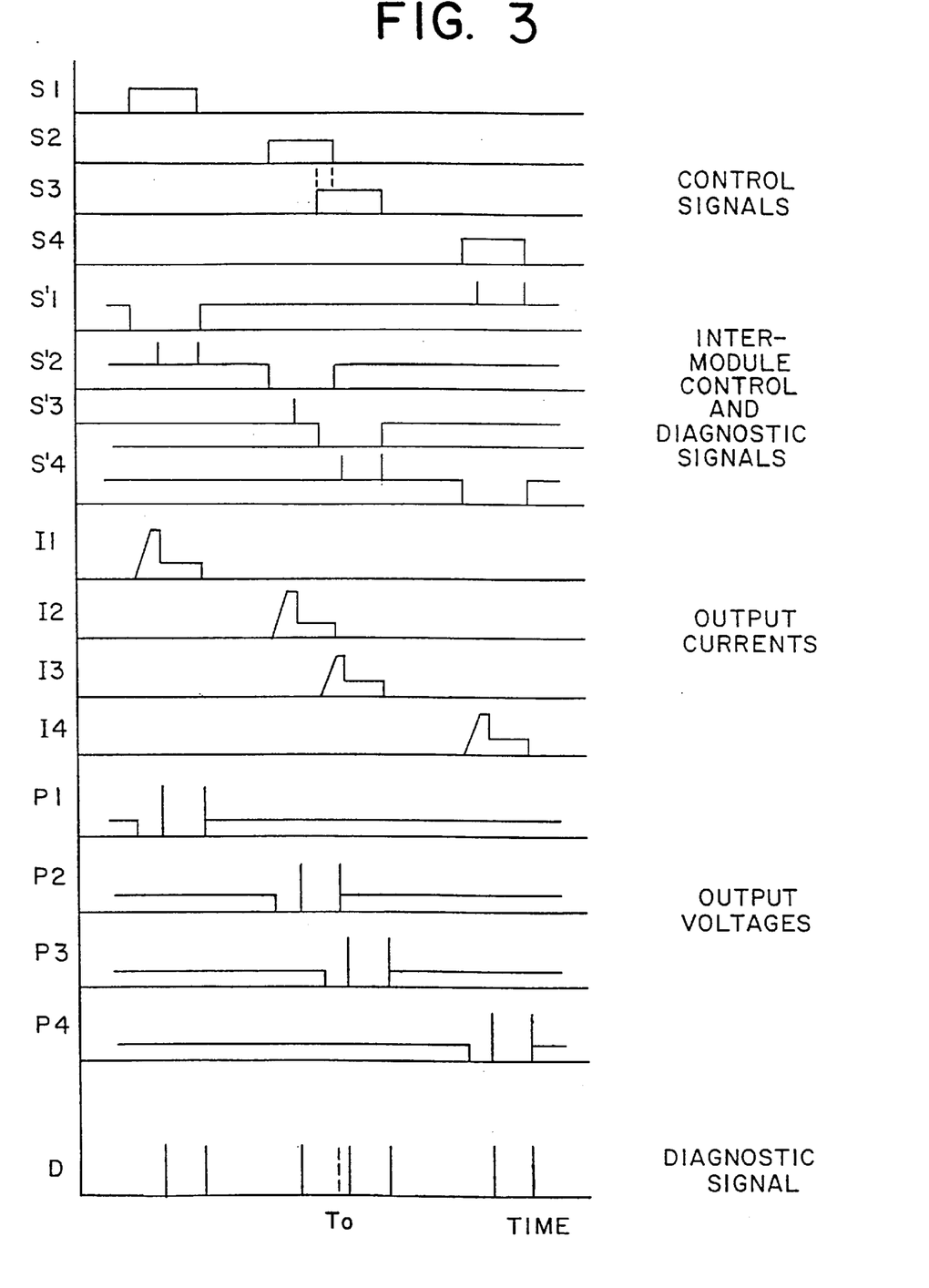
FIG. 3 is a series of waveform diagrams related to the circuitry pulses overlapping.

For high engine RPM, the pulses may overlap with respect to time as shown for control signals S2 and S3 in FIG. 3. In the situation when the input signals are overlapping (possibly at high engine RPM, long pulses), the returning diagnostic pulse is suppressed because the input signal is "low," such as at time To in the P2 waveform shown in FIG. 3. In this case, the system still works properly and the different diagnostic signal D may still be interpreted by the master controller module. The controller, microprocessor or other intelligent circuit knows when the diagnostic pulse should occur and when control signals S1, S2, S3, ... SN are overlapping. This is possible because the inductive loads 50 are driven synchronously, as opposed to asynchronously, so that the sequence in which they are driven permits the controller 70 to correlate diagnostic information concerning the inductive loads with the inductive loads being driven.

The control signals trigger the low side switches 72 to transmit a further control signal to the remote module 20 via a respective one of the control voltage transmission lines 30 in the form of a negative-going square wave pulse (the inverse of the control signal S1, S2, S3 or S4).

The low side driver and interface circuitry 90 in the remote module 20 of FIG. 1B each respond to respective negative-going square wave pulses for driving the associated inductive loads 50 sequentially. The circuitry 90 may include, for instance, inverting circuitry and N-channel FET transistors that respond to negative-going pulses for directing the driving of respective inductive loads. Each driven inductive load 50 (e.g., actuator, injector, etc.) generates its own output current pulse, exemplified by the waveform characteristics in FIG. 2 for currents I1, I2, I3 and I4. The pulse timing coincides with the pulse timing in lines S1 to S4.

The circuitry 90 drives the inductive load initially at a high positive-going voltage and current level for a relatively short period of time. Thereafter, the voltage and the current level are lowered and held for a longer duration. The circuitry 90 is shown only schematically in FIG. 1B. The actual circuitry is more complex than is represented in the schematic. Suitable circuitry is commercially available from Cherry Semiconductor, Injector Solenoid Driver Model No. CS-452/453 by adding an inverter before the input since it responds to active high input and also available from Motorola, Integrated Solenoid Driver Model Nos. MC 3484, 3484S2-2 and MC 3484S4-2. The preferred circuitry is disclosed in U.S. patent application Ser. No. 08/306,226, filed Sep. 19, 1994, entitled "Fuel Injector Failure Detection Circuit", the contents of which are incorporated herein by reference.

The output current waveform characteristic depicted has two intervals of sudden and steep current drop. These drops are reflected in the generation of two diagnostic signals in a conventional manner that coincide in timing with the occurrence of the drops. In this case, one inductive spike is generated shortly after attaining the peak current level when the current level drops and is held for a period. At the end of the period, the level drops to zero and another inductive spike is generated. Thus, inductive spikes occur during the middle of the output current generation and at its termination.

A typical application may be to open a vehicle fuel injector quickly by driving it at a high positive-going voltage level (e.g., 75 volts at 10 amps) and, shortly thereafter, holding the injector in the open state under battery voltage level (e.g., at 2.5 amps) for a sufficient time to complete desired injector fuel flow. The battery voltage is at a lower current level than that of the initial high positive voltage. Each time there is a sudden drop in the output current, such an event triggers an inductive spike. Driving an inductive load such as an injector, ignition coil, actuator, relay, electric valve, etc., a certain current waveform may be required. Depending on the technical requirements a current waveform (In) can have a form such as one of the four presented on FIGS. 5A–5H.

These drive currents can be provided using two methods. The first method is the switch mode technique. This waveform has the characteristic saw-like contour. The second method is the linear method. In this method, the driver operates as a constant current supply. This waveform is smooth but its shape is essentially the same as with the switch mode technique. Regardless of the method being used, when this inductive load is deenergized (causing a rapid decay of the current) a fly-back voltage pulse is generated. The changing current waveforms (In) in FIGS. 5A and 5C produce two voltage pulses. The first pulse (Pn) is generated when the current (In) drops from a high level (peak level) to a low level (hold level). The second pulse (Pn) is generated when a load is turned off.

Figure 5:
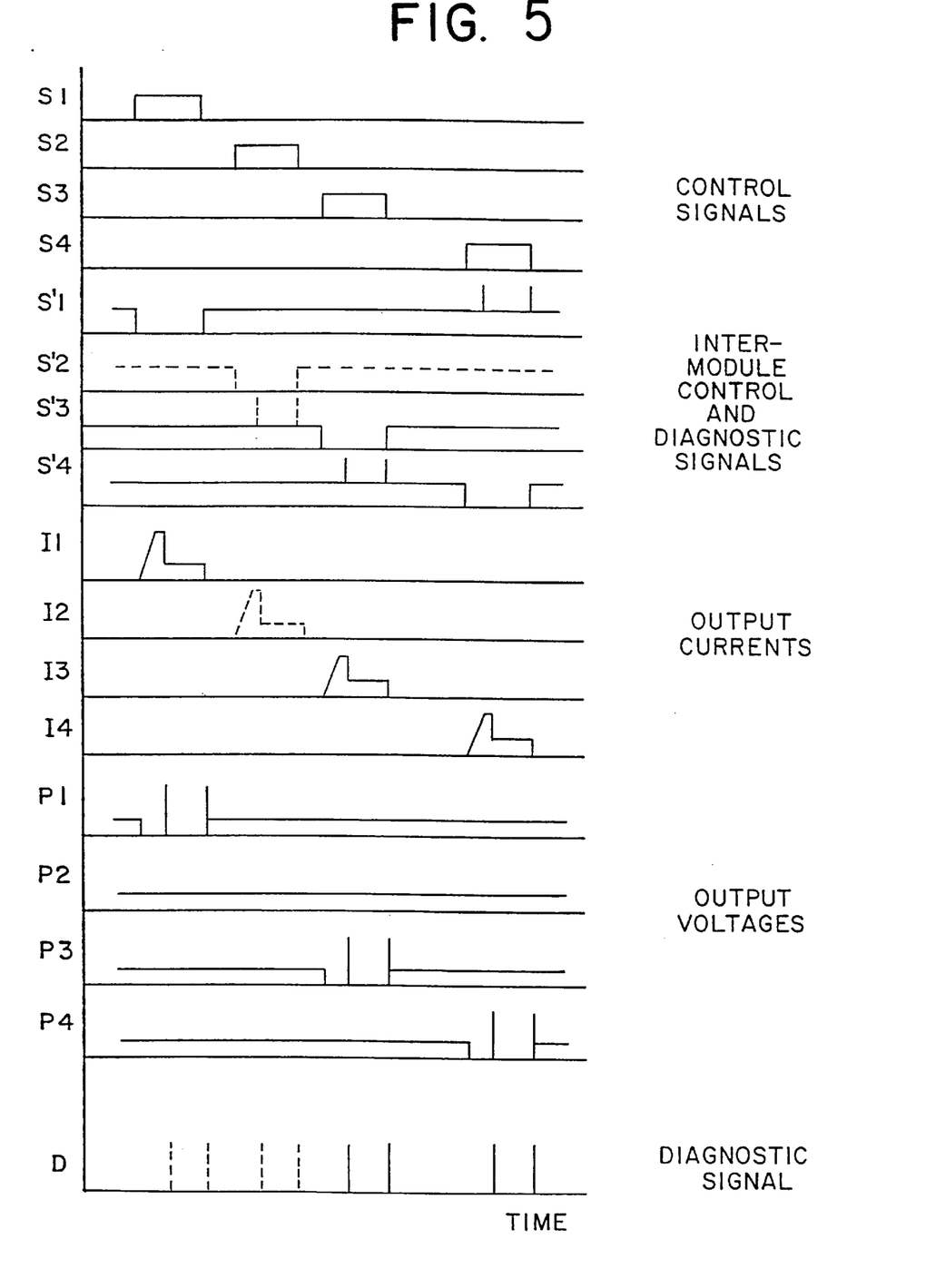
FIG. 5 is a waveform diagram as in FIG. 2, except that a shorted or open line (containing signals S'1, S'2, ... S'N) blocks feedback information from two lines.
Figure 5A:
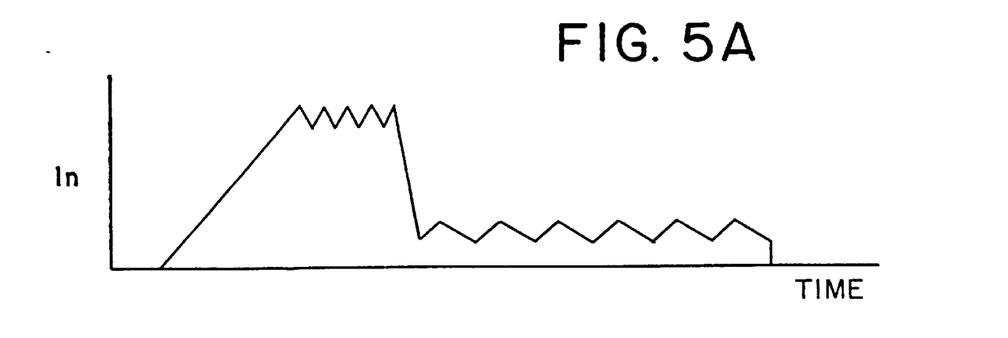
FIGS. 5A, 5B, 5C, 5D, 5E, 5F, 5G, and 5H are current and pulse waveforms associated with different inductive loads.
Figure 5B:
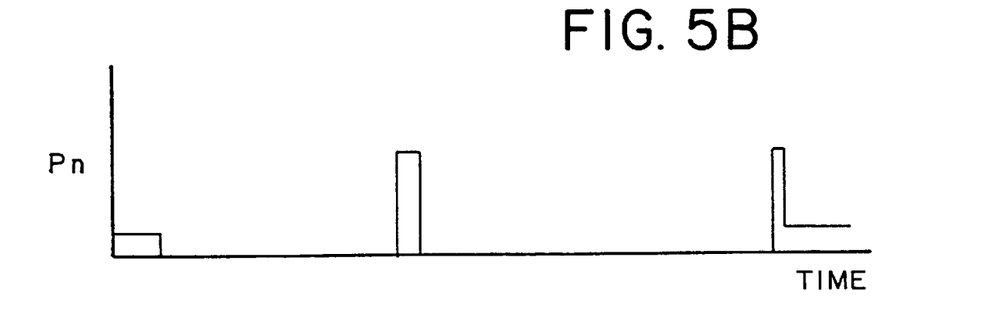
Figure 5C:
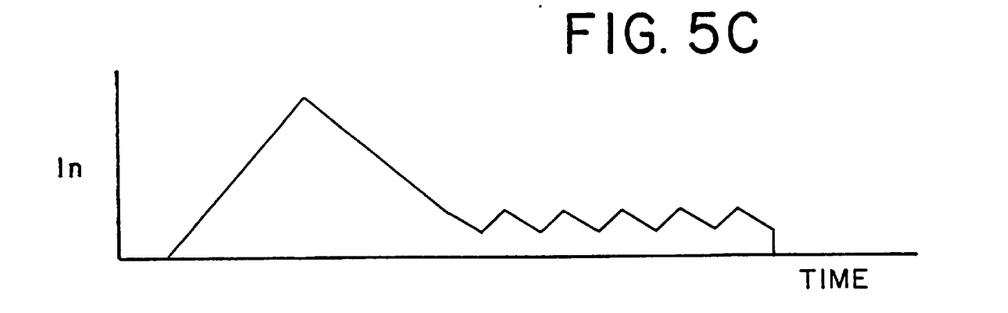
Figure 5D:
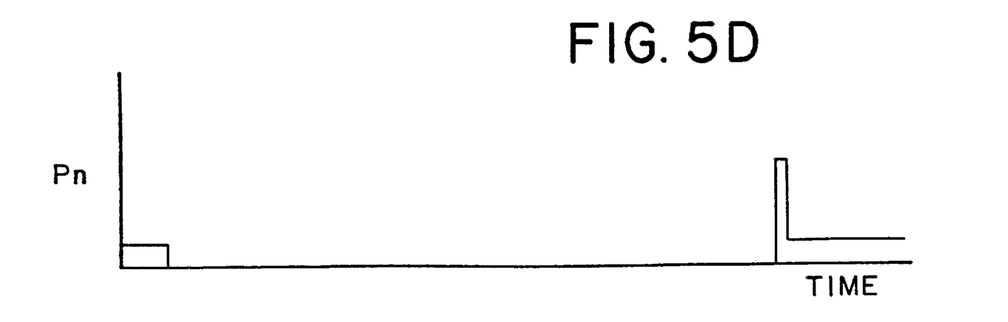
Figure 5E:
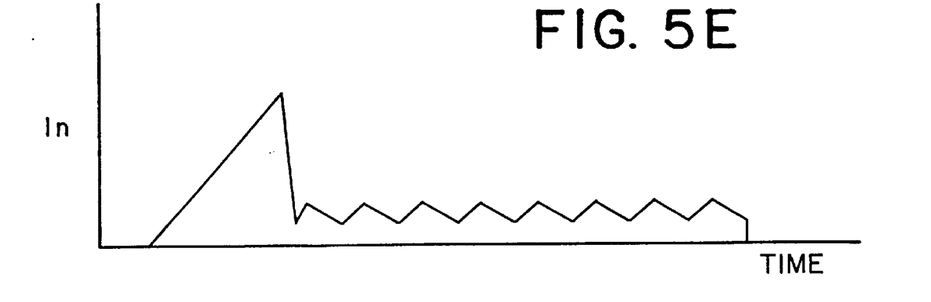
Figure 5F:
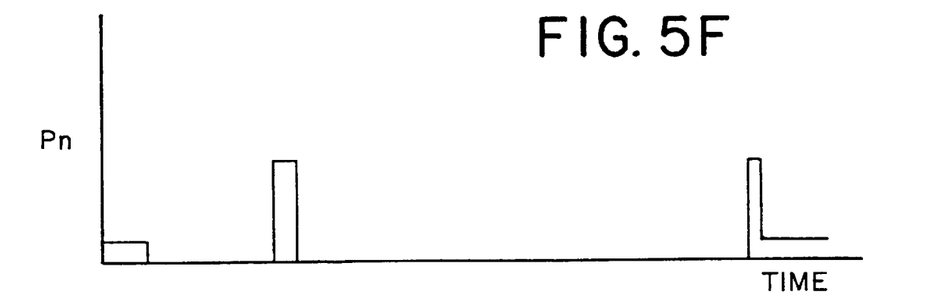
Figure 5G:
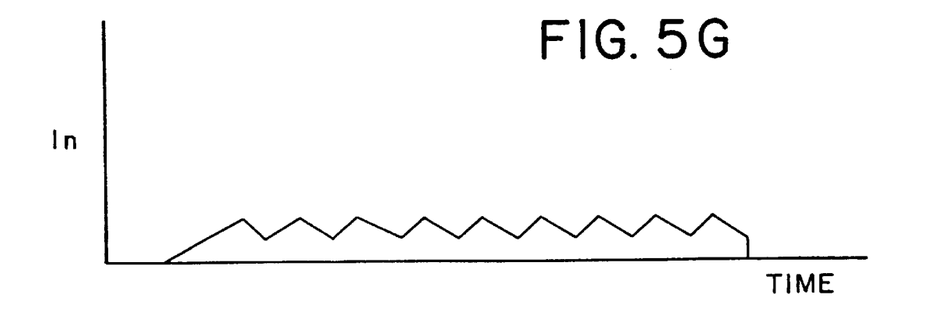
Figure 5H:
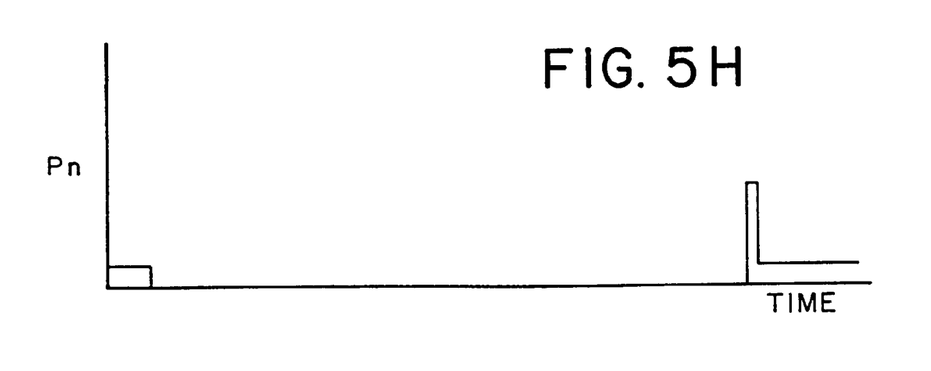

For illustration purposes only the waveform of FIGS. 5A and 5B, which represents the linear method of driving inductive load, was chosen to describe this embodiment of the invention. The waveforms of FIGS. 5C and 5D, 5E and 5F, and 5G and 5H, respectively, are only variations of the first waveform of FIGS. 5A and 5B.

For diagnostic purposes, it may be useful to detect the first spike. Its presence indicates that the high positive voltage level was attained sufficient for opening the injector. Its absence could mean either that the high positive voltage level was not reached or that the switching from the high positive voltage to the battery voltage never took place.

In the circuitry of FIGS. 6A and 6B, and 7A and 7B detection of such a first pulse is not possible since it would be suppressed by the low side drivers 87. Only the second or end spike is detected since by that time, the inductive load is no longer being driven.

Conventionally, diagnostic signals are sent back to the controller 70 via dedicated wires 91 and pins. The present invention avoids the necessity for such dedicated wires and pins. Instead, the diagnostic signals are mixed or intermodulated onto the control voltage transmission lines 30 for other loads, such as those on the next successive line or second successive line, but without changing the timing of the diagnostic signals.

Mixing the diagnostic signal or fly-back pulse onto the control signal input line for the next inductive load to be driven does not interfere with the driving of that load. As can better be seen in FIG. 2, the intermodule control and diagnostic signals of S'1 to S'4 have waveform characteristics in which the control signals are negative-going voltages, while the diagnostic signals or fly-back pulses have relatively high positive-going voltages. Since the low side driver and interface circuitry 90 does not respond to the high positive-going voltages, the presence of the diagnostic signals in its input does not pose a problem.

In FIG. 1B, a zener diode 92 clamps the output voltage of the diagnostic signals to keep their magnitude within predetermined levels. The series connection of diode 94 and resistor 96 connects the diagnostic signal from the low side of the load to the control signal line 30 of the adjacent circuit. Diode 94 is electrically connected to isolate lines to the low side of the loads from each other so that control voltage entering as an input on lines S'1 to S'n to one driver is not applied to the previous load. These diodes also prevent the low load conditions on one of the lines 40 from acting as a control signal input for another load. Resistors 96 are provided so as to limit the current of the diagnostic signals to prescribed levels.

The diagnostic signals on lines S'1 to S'n are sent back to the master module 10. There they separately pass through diodes 74 and are combined at a node 99. These signals are separated in time so the signal at node 99 is a multiplexed signal combining the diagnostic signals from all of the loads. Zener diode 76 prevents this multiplexed signal from being too large in magnitude.

The microprocessor 70 analyzes the series of diagnostic signals at its D input and takes action in relation thereto, e.g. set a fault indicator.

The intermodule control and diagnostic signals S'1, S'2, S'3 and S'4 of FIG. 2 are each shown having superimposed waveform characteristics derived from mixing or intermodulating the output voltage of the diagnostic signals in output lines 40 onto the control voltage transmission in successive ones of the control voltage transmission lines 30. Nevertheless, the high positive voltage diagnostic signal does not disturb the normal function of the input to the remote module because the control voltage remains at a low level while the diagnostic signal has a high positive voltage. The driving circuitry only responds to negative going pulse voltages.

Where the diagnostic signal timing overlaps with the timing of the control voltage in the succeeding line (e.g., the line containing signal S'3), it becomes grounded and does not alter the control voltage signal itself. As a result, one of the two diagnostic signals associated with the current output I2 becomes suppressed, that is, the input signal is active as "low" (see time To in the P2 output voltage waveform of FIG. 3). The diagnostic detection in the master module still works properly because the other diagnostic signal will still be read. Note the diagnostic signal characteristic (waveform D in FIG. 3) is in the form of a pulse train.

Figure 4:
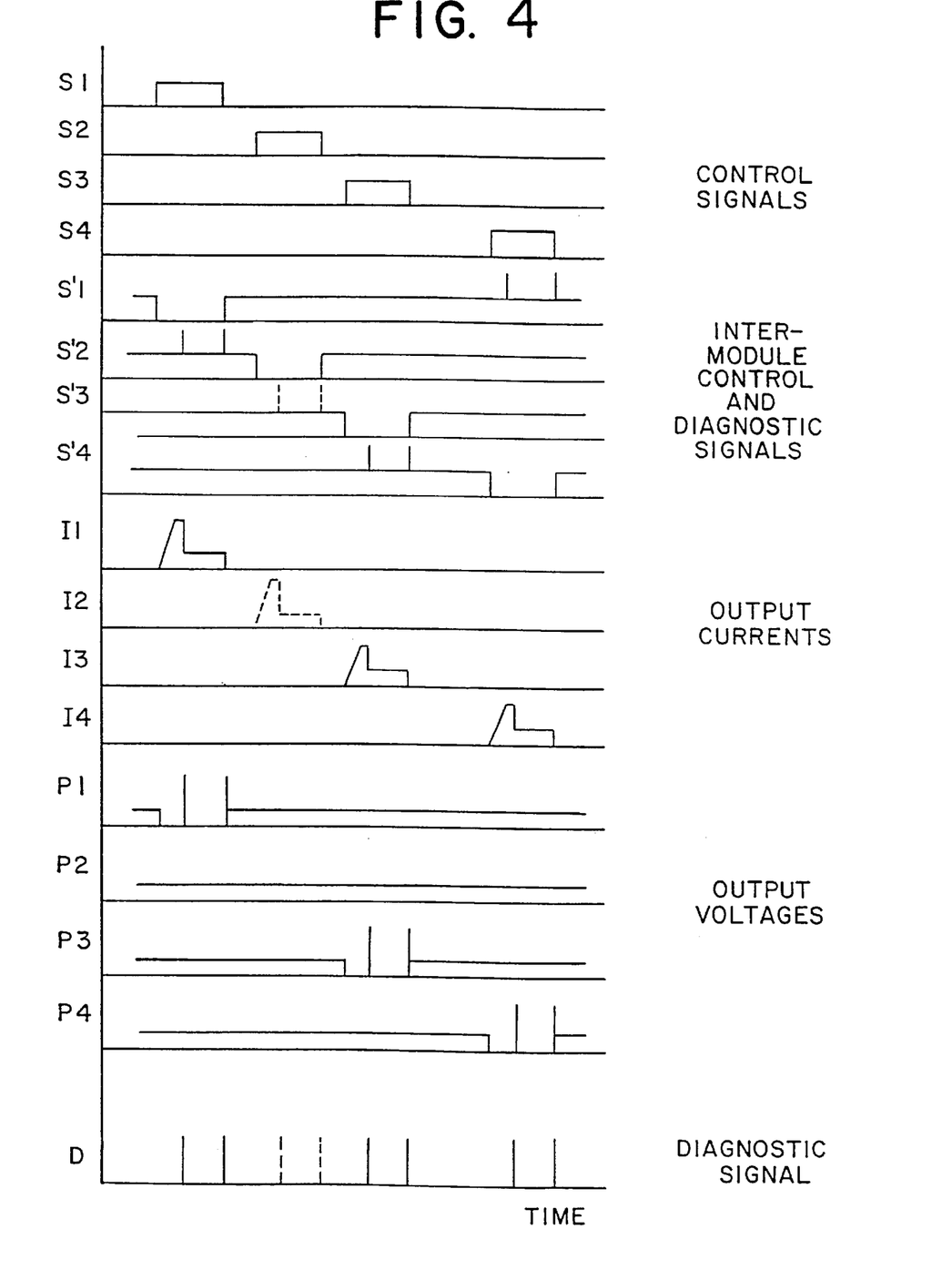
FIG. 4 is a series of waveform diagrams as in FIG. 2, except that the load L2 has failed.

FIG. 4 reflects the waveform characteristics where the load L2 failed, which causes the absence of both the current output I2 and the voltage fly-back pulse output voltage P2. Note the diagnostic signal characteristic waveform D in FIG. 4 and how such a pulse train differs from that in FIG. 2, i.e., it has two missing pulses.

An additional benefit of the configuration of FIG. 1, is the diagnostic capability of the connections between the master and remote modules. A shorted or open line (S'1, S'2, ... S'n) will break the feedback information on two lines.

FIG. 5 reflects the waveform characteristics where the line 30 containing the signal S'2 breaks due to being open or shorted. Such a break causes disruption of the feedback information from two lines (those containing signals S'1, S'2) so that load L2 can not be driven. This results in a corresponding fly-back pulse being absent from the line 30 (D of FIG. 5) that contains the signal S'2. Further, the fly-back pulse from load L1 can not be sent back through the line 30 that contains the signal S'2.

The diagnostic signal waveform D of FIG. 5 is different from that of FIGS. 2–4 due to the absence of signal S'2 shown in dotted line in FIG. 5. It should now be appreciated that the fly-back pulses are multiplexed to provide the waveform D of FIGS. 2–5. Each is easily recognized by the controller 70 to determine the applicable diagnostic condition.

A preferred embodiment of the present invention employs low side switches and drivers and the further control signal responsible for causing the driving of the inductive loads is in the form of a negative-going square wave pulse. A functionally equivalent circuit may be obtained, however, where high side switches and drivers are used instead of low side switches and drivers with the further control signal being a positive square wave pulse. Other components in the system would be revised accordingly in a manner evident to those skilled in this technical field. Further, where a component is mentioned as being for clamping the voltage or limiting the current to prescribed levels, it is understood that such is for protecting the electronic control circuitry, such as the controller 70.

For ease of discussion, FIGS. 1A and 1B show the output lines 40 connected to sequential ones of the control voltage transmission lines 30 through the diodes 94 and resistors 96. However, it makes no difference in the invention which lines 30 are connected to which output lines 40, so long as the microprocessor knows the order of connection.

By rearranging the connection, the problems associated with losing the end inductive spike due to overlap of successive control signals can be avoided. If, for example, the diagnostic lines are offset by two control voltage transmission lines, the control signal on the immediately adjacent line will not prevent the end inductive spike from reaching the common line 78. Thus, the suppression of the diagnostic signal at time To in FIG. 3 due to the overlap of the control signals does not prevent such a diagnostic signal from being mixed onto another of the control signals whose timing will not suppress it.

The system described above can be realized in many different ways. The goal is to keep the number of components to a minimum. The N subcircuits (low side drivers and interface) and N inductive loads do not have to be identical and do not have to generate exactly the same waveforms.

The present invention was developed for diagnostics which eliminate the need of any additional diagnostic line (or lines) between a master controller and its remote modules to detect the failures of remote inductive loads. Furthermore, the intermodule connections could also be checked without additional wires or components.

While the foregoing description and drawings represent the preferred embodiments of the present invention, it will be understood that various changes and modifications may be made without departing from the spirit and scope of the present invention.

What is claimed is:

1. A circuit for detecting diagnostic information of sequentially driven loads, comprising:
    a master module;
    a remote module physically separate from said master module;
    a plurality of lines electrically connecting said modules together;
    control logic circuitry within said master module that generates control signals in a timed manner for directing inductive loads to be driven in a sequential manner;
    master module switches within said master module responsive to receipt of said control signals for transmitting further control signals to said remote module via respective ones of said lines, wherein said control logic circuitry causes the control signals each to have a square wave pulse configuration, said master module switches inverting the square wave pulse configuration for the further control signals;
    remote module switches within said remote module responsive to receipt of said further control signals for driving said inductive loads in said sequential manner; and
    multiplex circuitry that derives diagnostic information corresponding with specific waveform characteristics of output current from a driven one of the inductive loads and mixes the diagnostic information onto a line having the control signal for another load and that transmits the mixed diagnostic information to said main module via that line.

2. A circuit as in claim 1, wherein said output currents from driving said induction loads each have a waveform characteristic that includes at least two sudden drops in current, the multiplex circuitry deriving two diagnostic signals a two fly-back pulses that correspond to said two sudden drops in current.

3. A circuit as in claim 2, wherein said multiplex circuitry connects the diagnostic information corresponding to the inductive load onto the connection line for a successively driven load and said master module causes the sequential further control signals for the loads to overlap partially with respect to time, said multiplex circuitry being configured to suppress the subsequent one of said two fly-back pulses when mixed onto said next one of the connection lines for the further control signal.

4. A circuit as in claim 2, wherein said multiplex circuitry is configured so that a failure of said one of said inductive loads results in said two fly-back pulses being absent from said pulse train.

5. A circuit as in claim 2, wherein said multiplex circuitry connects the diagnostic information corresponding to the inductive load onto the line for the next successively driven load and said multiplex circuitry is configured so that any one of a short and break of the same next sequential one of said lines results in said two fly-back pulses being absent form said pulse train and also results in an additional sequential two fly-back pulses being absent from said pulse train.

6. A circuit for detecting diagnostic information of sequentially driven loads, comprising:
    a master module;
    a remote module physically separate from said master module;
    a plurality of lines electrically connecting said modules together;
    means for transmitting control signals from said master module to said remote module via respective ones of said connection lines wherein said transmitting means causes the control signals each to have a negative-going square wave pulse configuration;
    means responsive to said control signals for driving associated ones of inductive loads; and
    multiplex means for deriving diagnostic information corresponding with specific waveform characteristics of output current from a driven one of the inductive loads and mixes the diagnostic information onto one of the lines having a next one of the further control signals and means for transmitting the mixed diagnostic information to said main module via the same next one of the lines as part of a multiplexed pulse train of diagnostic information.

7. A circuit us in claim 6, wherein said output currents from driving said inductive loads each have a waveform characteristic that includes at least two sudden drops in current, said multiplex means including means for deriving two diagnostic signals as two fly-back pulses that correspond to said two sudden drops in current.

8. A circuit as in claim 6, wherein said multiplex circuitry mixes the diagnostic information corresponding to the inductive load onto the line having the further control signal for the next successively driven load and said master module causes the sequential further control signals for the loads to overlap partially with respect to time, said multiplex circuitry being configured to suppress the subsequent one of said two fly-back pulses when mixed onto said next one of the lines for the further control signal.

9. A circuit as in claim 7, said multiplex means is configured so that a failure of said one of said inductive loads results in said two fly-back pulses being absent from said pulse train.

10. A circuit as in claim 7, wherein said multiplex circuitry mixes the diagnostic information corresponding to the inductive load onto the line for having the further control signal for the next successively driven load and said multiplex means is configured so that any one of the short and break of the same next sequential one of said lines results in said two fly-back pulses being absent from said pulse train and also results in an additional sequential two fly-back pulses being absent from said pulse train.

11. A circuit as in claim 6, wherein said multiplex circuitry includes an arrangement that conveys the mixed diagnostic information transmitted via each of said connection lines into a common line that enters said main module.

12. A circuit for detecting diagnostic information of sequentially driven loads, comprising:
   a master module;
   a remote module physically separate from said master module;
   a plurality of connection lines electrically connecting said modules together;
   means for sequentially driving inductive loads in response to transmission of associated control signals from said master module to said remote module via respective ones of said connection lines, wherein said sequentially driving means causes the control signals each to have a negative-going square wave pulse configuration;
   means for generating diagnostic signals in sequence that correspond with specific waveform characteristics of output current from driven ones of a plurality of inductive loads; and
   multiplex means for multiplexing the diagnostic signals in sequence into a pulse train and for transmitting pulses of the pulse train to said master module via the lines so that the diagnostic signals associated with each currently driven one of the inductive loads are transmitted through one of the lines that is other than that through which the currently driven one of the inductive loads was driven by said sequentially driving means.

13. A circuit as in claim 12, wherein said driven inductive load generates an output current that has a waveform characteristic having at least two sudden drops in current, said multiplex means including means for deriving the diagnostic signals as fly-back pulses that correspond to said two sudden drops in current.

14. A circuit as in claim 13, wherein said master module causes the two sequential ones of said control signals to overlap with respect to time, said multiplex means being configured for suppressing one of said two fly-back pulses when mixed onto said next one of the control signals.

15. A circuit as in claim 13, wherein said multiplex means is configured so that a failure of said one of said inductive loads results in said two fly-back pulses being absent from said pulse train.

16. A circuit as in claim 13, wherein said multiplex means is configured so that any one of a short and break of the same next sequential one of said lines results in said two fly-back pulses being absent from said pulse train and also results in an additional sequential two fly-back pulses being absent from said pulse train.

17. A circuit for detecting diagnostic information of sequentially driven loads, comprising:
   a master module;
   a remote module physically separate from said master module;
   a plurality of lines electrically connecting said modules together;
   means for transmitting control signals from said master module to said remote module via respective ones of said connection lines, at least two of said control signals overlapping each other with respect to time within a sequential two of said lines;
   means within said remote module for driving inductive loads in response to receipt of corresponding ones of the control signals; and
   multiplex means for multiplexing pairs of fly-back pulses into a pulse train entering said master module, each of said pairs of fly-back pulses corresponding to specific waveform characteristics of output current of a respective driven one of said inductive loads and being mixed onto a next one of said lines for control signals other than that which caused a current one of said respective inductive loads to be driven, said pulse train having a plurality of said pairs of fly-back pulses for which said multiplex means is configured so that:
   one of said tow fly-back pulses is suppressed when mixed onto one of the overlapping control signals, a failure of said one of said inductive loads associated with a sequential one of said overlapping control signals results in said two fly-back pulses being absent from said pulse train, and any one of a short and break of a sequential one of said lines that contains the control signal that is overlapped by another with respect to time results in said two fly-back pulses being absent from said pulse train and also results in an additional sequential two fly-back pulses being absent from said pulse train.

18. A method for detecting diagnostic information of sequentially driven loads, comprising the steps of:
   sequentially driving inductive loads in response to transmission of associated control signals from a master module to a remote module via respective ones of lines, the modules being physically separate from each other and said lines electrically connecting said modules together;
   generating diagnostic signals in sequence that correspond with specific waveform characteristics of output current from driven ones of the inductive loads; and
   multiplexing the diagnostic signals in sequence into a pulse train and transmitting pulses of the pulse train to said master module via sequential ones of the lines so that the diagnostic signals associated with each currently driven one of the inductive loads are transmitted through a next one of the lines that is other than that through which the currently driven one of the inductive loads was driven by the step of sequentially driving.

19. A method as in claim 18, wherein the step of multiplexing includes mixing the diagnostic signals, which are associated with the currently driven one of the inductive loads, onto one of the control signals that is in the next sequential one of the lines, which is other than that through which the currently driven one of the inductive loads was driven.

20. A method as in claim 18, wherein said step of sequentially driving causes the control signals each to have a negative-going square wave pulse configuration.

21. A circuit as in claim 19, wherein said driven inductive load generates an output current that has a waveform characteristic having at least two sudden drops in current, the step of multiplexing including deriving the diagnostic signals as fly-back pulses that correspond to said two sudden drops in current.

22. A circuit as in claim 21, wherein contents of said master module cause the two sequential ones of said control signals to overlap with respect to time, the step of multiplexing including suppressing one of said two fly-back pulses when mixed onto said next one of the control signals.

23. A circuit as in claim 21, wherein the step of multiplexing includes, in response to a failure of said one of said inductive loads, an absence of said two fly-back pulses from said pulse train.

24. A circuit as in claim 21, wherein the step of multiplexing includes, in response to any one of a short and break of the same next sequential one of said lines, an absence of said two fly-back pulses from said pulse train and also an absence of an additional sequential two fly-back pulses from said pulse train.

25. A circuit as in claim 18, wherein the step of multiplexing further includes transmitting the pulse train via a common line prior to entering the master module, each of the lines branching from the common line.

* * * * *